(12) United States Patent
Lu et al.

(10) Patent No.: US 10,373,754 B2
(45) Date of Patent: Aug. 6, 2019

(54) POWER SUPPLY MODULE HAVING TWO OR MORE OUTPUT VOLTAGES

(71) Applicant: Delta Electronics (Shanghai) CO., LTD, Shanghai (CN)

(72) Inventors: Zengyi Lu, Shanghai (CN); Shaohua Zhu, Shanghai (CN); Haijun Yang, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 281 days.

(21) Appl. No.: 15/447,267

(22) Filed: Mar. 2, 2017

(65) Prior Publication Data

US 2017/0287615 A1   Oct. 5, 2017

(30) Foreign Application Priority Data

Mar. 31, 2016   (CN) .......................... 2016 1 0200397

(51) Int. Cl.
| | |
|---|---|
| *H01F 27/24* | (2006.01) |
| *H01F 1/34* | (2006.01) |
| *H01F 27/28* | (2006.01) |
| *H02M 3/156* | (2006.01) |
| *H05K 1/18* | (2006.01) |

(Continued)

(52) U.S. Cl.
CPC .............. *H01F 27/24* (2013.01); *H01F 1/34* (2013.01); *H01F 27/2823* (2013.01); *H02M 3/00* (2013.01); *H02M 3/156* (2013.01); *H05K 1/18* (2013.01); *H05K 1/184* (2013.01);

(Continued)

(58) Field of Classification Search
CPC ........ H01F 27/24; H01F 27/2823; H01F 1/34; H05K 1/184; H05K 1/18; H05K 2201/086; H05K 2201/1003; H02M 3/00; H02M 3/156; H02M 2001/008
See application file for complete search history.

(56) References Cited

U.S. PATENT DOCUMENTS

| | | | |
|---|---|---|---|
| 7,830,235 B2 | 11/2010 | Raiser et al. | |
| 7,983,063 B2 * | 7/2011 | Lu ........................ | H02M 3/285 363/21.12 |

(Continued)

FOREIGN PATENT DOCUMENTS

| | | |
|---|---|---|
| CN | 103489569 A | 1/2014 |
| CN | 104285264 A | 1/2015 |

*Primary Examiner* — Jared Fureman
*Assistant Examiner* — Michael J Warmflash
(74) *Attorney, Agent, or Firm* — Yunling Ren

(57) ABSTRACT

A power supply module having two output voltages includes an inductor module and a main board. The inductor module includes a first magnetic core, a second magnetic core, an intermediate magnetic core disposed therebetween, a first winding and a second winding. The first winding is disposed on one of a magnetic column of the first magnetic core and a magnetic column of the intermediate magnetic core to form a first inductor. The second winding is disposed on one of a magnetic column of the second magnetic core and a magnetic column of the intermediate magnetic core to form a second inductor. There is no air gap at a portion of the intermediate magnetic core where magnetic paths of the first and second inductors pass through together. The inductor module is disposed on the main board. The first winding and the second winding are electrically connected with the main board.

20 Claims, 14 Drawing Sheets

(51) Int. Cl.
*H02M 3/00* (2006.01)
*H02M 1/00* (2006.01)

(52) U.S. Cl.
CPC . *H02M 2001/008* (2013.01); *H05K 2201/086* (2013.01); *H05K 2201/1003* (2013.01)

(56) References Cited

U.S. PATENT DOCUMENTS

| | | | | |
|---|---|---|---|---|
| 8,922,316 | B2* | 12/2014 | Lu | H01F 27/28 323/355 |
| 2009/0046486 | A1* | 2/2009 | Lu | H02M 3/285 363/45 |
| 2013/0162384 | A1* | 6/2013 | Lu | H01F 27/28 336/178 |

* cited by examiner

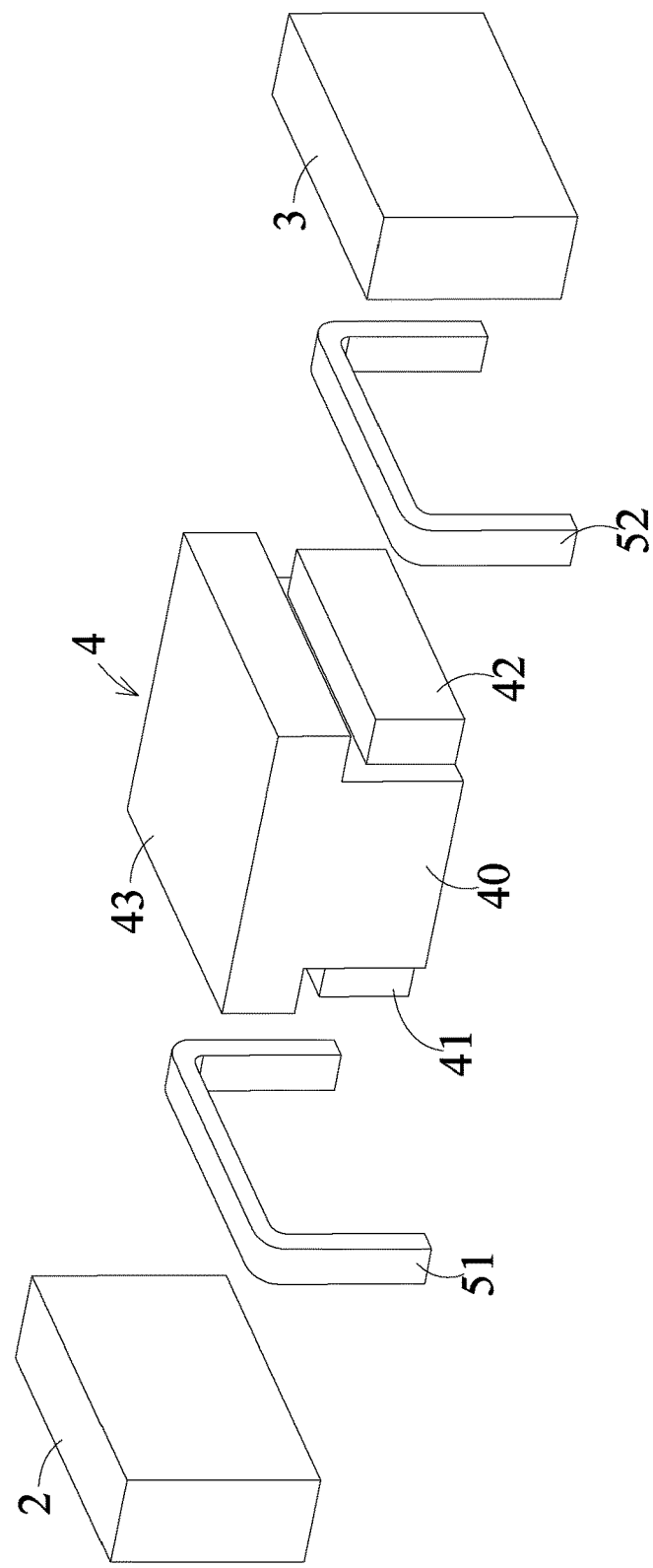

POWER SUPPLY MODULE HAVING TWO OR MORE OUTPUT VOLTAGES

CROSS REFERENCE

This application is based upon and claims priority to Chinese Patent Application No. 201610200397.8, filed on Mar. 31, 2016, the entire contents thereof are incorporated herein by reference.

TECHNICAL FIELD

The disclosure relates to a power supply module and, particularly, to a power supply module having two or more output voltages.

BACKGROUND

Inductor module is a key module in P-BLOCK power supply module. A conventional inductor module is large in size and heavy in weight, which accounts for over 80% of the whole power supply module in both size and weight. To reduce the size and weight of the inductor module, a pair of EI- or EE-structured magnetic cores is used in existing designs to integrate two separate inductors together to form an integrated inductor module so as to reduce the weight. Moreover, a footprint area occupied by magnetic components on the power board can be efficiently decreased, helping to enhance the power density.

Referring to FIGS. 1 and 2, FIG. 1 is a block diagram illustrating an assembly structure of a conventional EI-shaped integrated inductor module, and FIG. 2 is an exploded perspective view illustrating the EI-shaped inductor module shown in FIG. 1. As shown in FIGS. 1 and 2, the conventional EI-shaped inductor module includes an I-shaped magnetic core 10, an E-shaped magnetic core 11, and two windings 12. The E-shaped magnetic core 11 comprises a center magnetic column 111 and two side magnetic columns 112.

As shown in FIG. 1, in the conventional EI-shaped inductor module, a tiny first air gap 110 is formed naturally between the center magnetic column 111 and the I-shaped magnetic core 10, while second air gaps 113 are formed between the side magnetic columns 112 and the I-shaped magnetic core 10, after assembly of the I-shaped magnetic core 10 and the E-shaped magnetic core 11 is completed. The first air gap 110 is an assembly air gap generated due to the assembly of two magnetic cores, which is unavoidable in the conventional EI-shaped inductor module. The second air gap 113 is an air gap artificially set in accordance with required inductance. However, when a size of the first air gap 110 and that of the second air gap 113 are in the same order of magnitude or in the similar order of magnitude, the two inductors may be not completely decoupled. Accordingly, when one of the inductors is in operating state while the other one is in non-operating state, a leakage voltage may be induced in the inductor which is in the non-operating state due to electromagnetic coupling between the two inductors.

The above-described information disclosed in the section of background is only for the purpose of contributing to understanding the context of the present disclosure and, thus, it may include information that does not constitute a related art known to those skilled in the art.

SUMMARY

It is a primary object of the present disclosure to overcome at least one of the above-described defects by providing a power supply module capable of reducing or avoiding generation of leakage voltage.

Additional aspects and advantages of the disclosure will be set forth in part in the description which follows and, in part, will be obvious from the description, or may be learned by practice of the disclosure.

According to an aspect of the disclosure, there is provided a power supply module having two output voltages, including an inductor module and a main board. The inductor module includes a first magnetic core, a second magnetic core, an intermediate magnetic core, a first winding and a second winding. The intermediate magnetic core is disposed between the first magnetic core and the second magnetic core. The first winding is disposed on one of a magnetic column of the first magnetic core and a magnetic column of the intermediate magnetic core adjacent to the first magnetic core to form a first inductor of which a first magnetic path being formed between the first magnetic core and the intermediate magnetic core. The second winding is disposed on one of a magnetic column of the second magnetic core and a magnetic column of the intermediate magnetic core adjacent to the second magnetic core to form a second inductor of which a second magnetic path being formed between the second magnetic core and the intermediate magnetic core. There is no air gap at a portion of the intermediate magnetic core where the first magnetic path and the second magnetic path pass through together, so as to avoid or reduce an induced voltage generated in the second inductor due to the first magnetic path or another induced voltage generated in the first inductor due to the second magnetic path. The inductor module is arranged on the main board, and the first winding and the second winding are electrically connected with the main board respectively.

According to another aspect of the disclosure, there is provided a power supply module having multiple output voltages, including an inductor module and a main board. The inductor module includes a first magnetic core, multiple intermediate magnetic cores, a second magnetic core and multiple windings, which are arranged in a row. The multiple windings are disposed, respectively, on one of a magnetic column of the first magnetic core and a magnetic column of the intermediate magnetic core which is one of the multiple intermediate magnetic cores adjacent to the first magnetic core, on one of two magnetic column of two adjacent ones of the multiple intermediate magnetic cores, and on one of a magnetic column of the second magnetic core and a magnetic column of the intermediate magnetic core which is one of the multiple intermediate magnetic cores adjacent to the second magnetic core, to form multiple inductors which are provided, respectively, with multiple magnetic paths by the first magnetic core and the intermediate magnetic core adjacent to the first magnetic core, by the two adjacent ones of the multiple intermediate magnetic cores, and by the second magnetic core and the intermediate magnetic core adjacent to the second magnetic core. There is no air gap at a portion of the intermediate magnetic core where any two adjacent ones of the multiple magnetic paths pass through together, so as to avoid or reduce induced voltages generated in other ones of the multiple inductors, due to one of the multiple magnetic paths corresponding to one of the multiple inductors. The inductor module is disposed on the main board, and the multiple windings are electrically connected with the main board respectively.

According to the disclosure, at least one of the following advantages and positive effects can be achieved. In the power supply module having two output voltages of according to the disclosure, the magnetic core of the inductor module is integrated by combining a first magnetic core, a second magnetic core, and an intermediate magnetic core disposed therebetween, and then incorporating a first winding and a second winding. Since the intermediate magnetic core is integrally formed without air gap, an induced voltage can be reduced or even avoided from being generated in the second inductor due to the first magnetic path of the integrated inductor module, as well as in the first inductor due to the second magnetic path. Therefore, in the present disclosure, when one of the inductors is in the operating state and the other in the non-operating state, there is no electromagnetic coupling or the electromagnetic coupling is very weak between the two inductors, so that a leakage voltage is prevented from being induced at the inductor in the non-operating state or the induced leakage voltage is very small.

BRIEF DESCRIPTION OF THE DRAWINGS

The above and other features and advantages of the present disclosure will become more apparent by describing in detail exemplary embodiments thereof with reference to the accompanying drawings.

FIG. 4C illustrates an exploded view of the inductor module in the power supply module shown in FIG. 4A.

DETAILED DESCRIPTION

Figure 1:
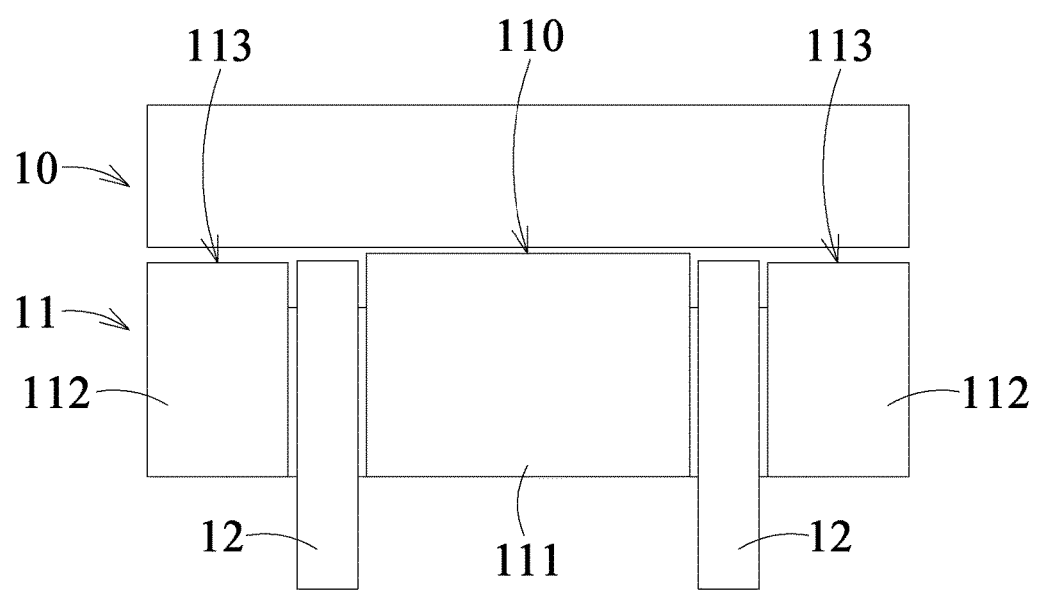
FIG. 1 is a block diagram illustrating an assembly structure of conventional EI-shaped inductor module.

Exemplary embodiments will now be described more fully with reference to the accompanying drawings. However, the exemplary embodiments can be embodied in many forms and should not be construed as limited to the embodiments set forth herein; rather, these embodiments are provided so that this disclosure will be made thorough and complete, and the concept of exemplary embodiments will be fully conveyed to those skilled in the art. Same or similar structures are denoted by same reference numbers in the drawings and, thus, a detailed description thereof will be omitted.

In order to reduce the size and weight of a multi-channel power supply, of which at least one of input terminal and an output terminal are independent of each other, a plurality of inductors can be integrated by means of a magnetic integration technique.

Figure 2:
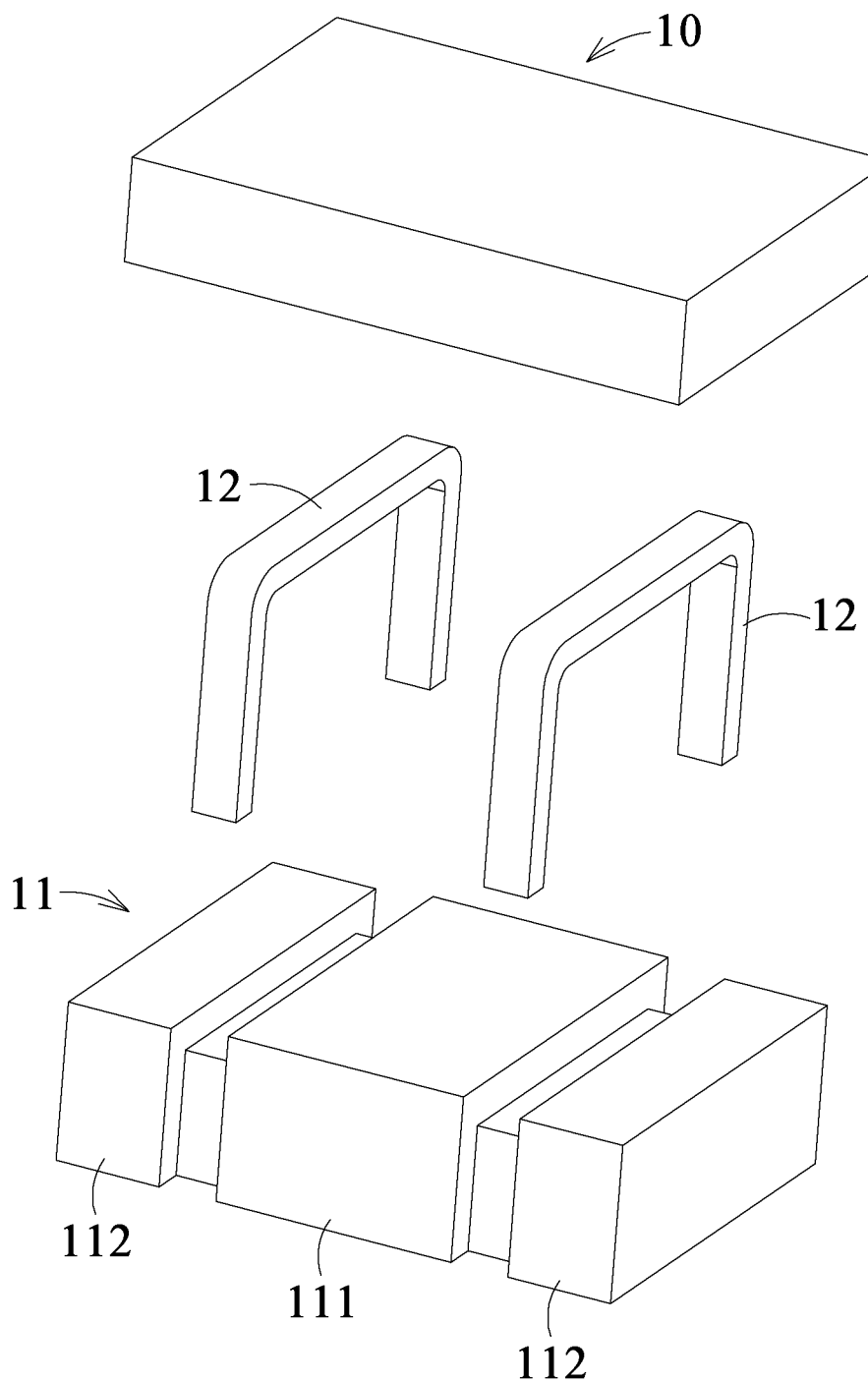
FIG. 2 illustrates an exploded view of the EI-shaped inductor module shown in FIG. 1.
Figure 3:
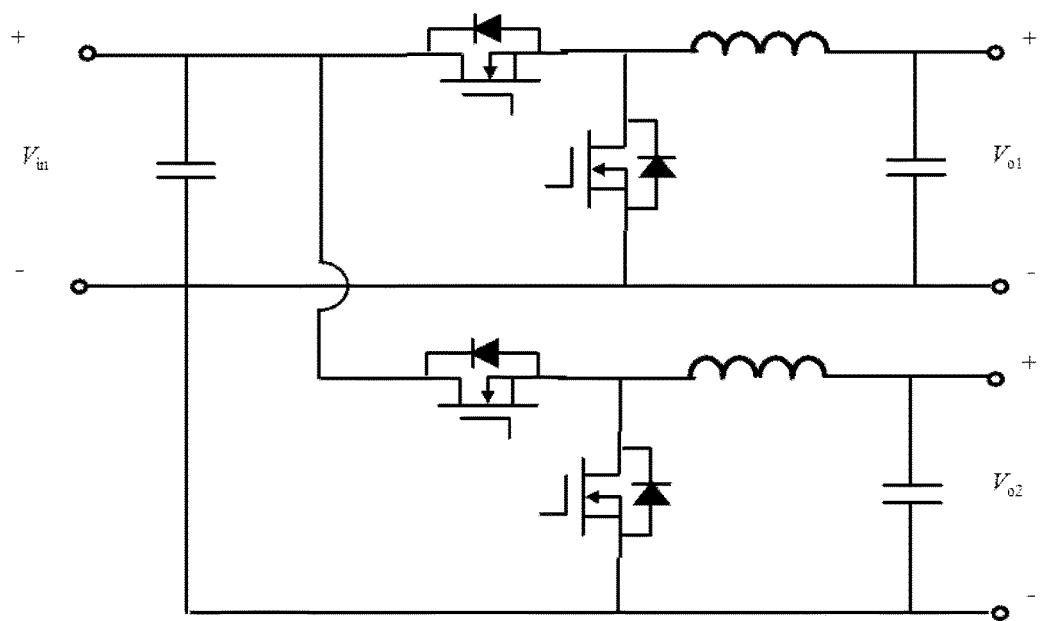
FIG. 3 is topology diagram illustrating a power supply circuit having two output voltages.

Referring to FIG. 3, it is a topology diagram illustrating a power supply circuit having two output voltages. As shown in FIG. 3, the power supply circuit includes two independent switching converters configured to output two independent output voltages, Vo1 and Vo2, respectively. The power supply circuit includes a first inductor Lo1 and a second inductor Lo2, wherein both the first inductor Lo1 and the second inductor Lo2 are implemented with a conventional integrated inductor module such as the inductor module shown in FIGS. 1 and 2. When the first switching converter operates normally and outputs a stable output voltage Vo1, electromagnetically coupling may occur between the first inductor Lo1 and the second inductor Lo2 of the integrated inductor module if the switching converter 2 is in the non-operating state. A voltage Vo2' (Vo2'≠0), which is referred to as leakage voltage, may be induced by a magnetic path of the first inductor Lo1 on the second inductor Lo2. The leakage voltage can be effectively avoided or reduced by the power supply module according to the present disclosure.

In the power supply module having two output voltages according to the disclosure, the magnetic core of the inductor module is formed by combining three parts, that is, the first magnetic core, the second magnetic core and the intermediate magnetic core, together. The first winding can be selectively wound on either the magnetic column of the intermediate magnetic core or that of the first magnetic core, so as to form the first inductor together. Similarly, the second winding may be selectively wound on either the magnetic column of the intermediate magnetic core or that of the second magnetic core, so as to form the second inductor together. The intermediate magnetic core is integrally formed without air gap (including combined air gap). There is a portion on the intermediate magnetic core, which provides the two inductors with magnetic paths, having no air gap. In other words, the magnetic paths of the two inductors do not pass through any air gap in this portion. According to the power supply module having two output voltages of the disclosure, an induced voltage can be reduced or even avoided from being generated in the second inductor due to the first magnetic path of the first inductor, as well as in the first inductor due to the second magnetic path of the second inductor. Various embodiments of the present disclosure are described below in detail with power supply modules having two output voltages as an example.

The First Embodiment of the Power Supply Module

Figure 4A:
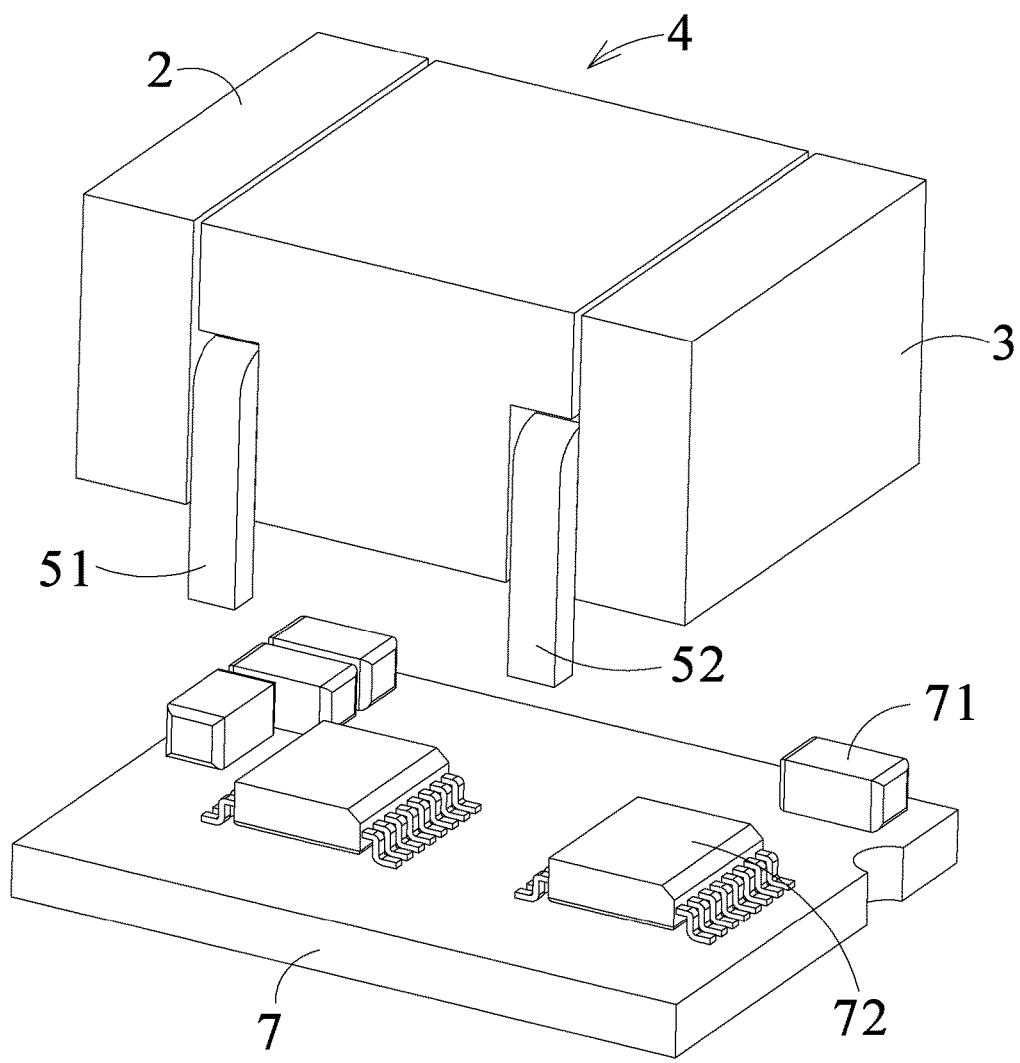
FIG. 4A illustrates an exploded view of the power supply module according to an embodiment of the present disclosure.
Figure 4B:
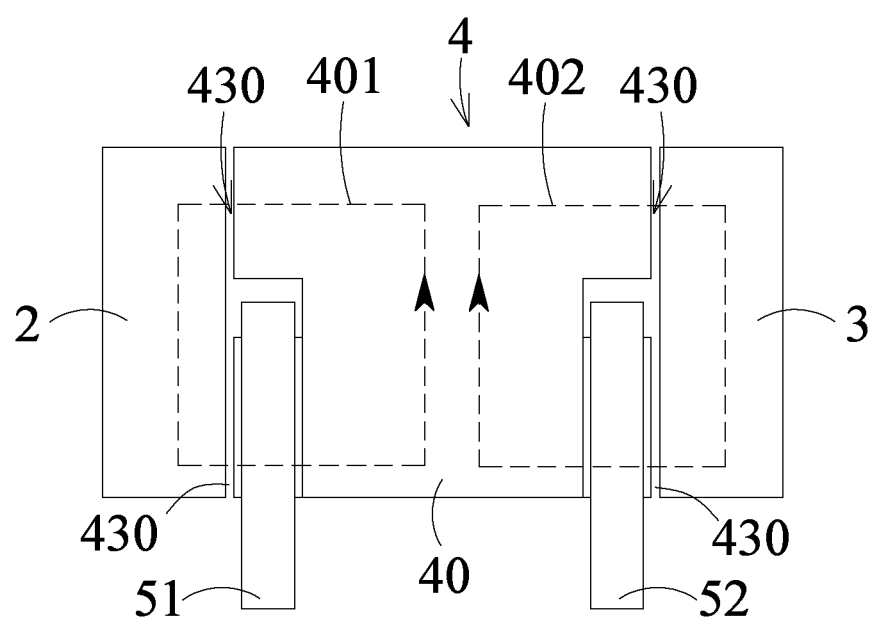
FIG. 4B is an assembly diagram illustrating an inductor module in the power supply module shown in FIG. 4A.

Referring to FIGS. 4A, 4B and 4C, FIG. 4A illustrates an exploded view of the power supply module according to an embodiment of the present disclosure, FIG. 4B is an assembly diagram illustrating an inductor module in the power supply module shown in FIG. 4A, and FIG. 4C illustrates an exploded view of the inductor module in the power supply module shown in FIG. 4A.

As shown in FIGS. 4A, 4B and 4C, the power supply module according to the first embodiment of the present disclosure has two output voltages, and includes an inductor module and a main board 7. The inductor module includes a first magnetic core 2, a second magnetic core 3, an intermediate magnetic core 4, a first winding 51 and a second winding 52.

The first magnetic core 2 is an "I"-shaped magnetic core, for example, in the form of a flat plate.

The second magnetic core 3 is an "I"-shaped magnetic core, for example, in the form of a flat plate.

The intermediate magnetic core 4, which may be made of a material having a high magnetic permeability such as ferrite, is disposed between the first magnetic core 2 and the second magnetic core 3. The intermediate magnetic core 4 is in shape of " ⊥ " and includes a main magnetic column 40, a first magnetic column 41 and a second magnetic column 42 provided on both sides of the lower portion of the main magnetic column 40, and a third magnetic column 43 provided on the top of the main magnetic column 40.

The third magnetic column 43 is integrally formed with the main magnetic column 40, with no air gap therebetween.

The first magnetic column 41 and the second magnetic column 42 are disposed symmetrically on both sides of the main magnetic column 40, which may be integrally formed with the main magnetic column 40, or may be separate magnetic columns secured to the main magnetic column 40 via adhesive or the like. An air gap may or may not exist between the first magnetic column 41, the second magnetic column 42 and the main magnetic column 40. After the first magnetic core 2, the second magnetic core 3 and the intermediate magnetic core 4 are assembled, the first magnetic column 41 of the intermediate magnetic core 4 is adjacent to the first magnetic core 2, the second magnetic column 42 of the intermediate magnetic core 4 is adjacent to the second magnetic core 3. There are air gaps 430 provided, respectively, between the first magnetic core 2 and the third magnetic column 43 of the intermediate magnetic core 4, between the first magnetic core 2 and the first magnetic column 41 of the intermediate magnetic core 4, between the second magnetic core 3 and the third magnetic column 43 of the intermediate magnetic core 4, as will as between the second magnetic core 3 and the second magnetic column 42 of the intermediate magnetic core 4.

The first magnetic column 41 and the second magnetic column 42 are relatively small in size to allow installation space for the windings. The first winding 51 and the second winding 52 may be preformed metallic conductors, such as copper conductors. In the first embodiment, the number of turns of the first winding is one, and the number of turns of the second winding is also one, but the present disclosure is not limited there. The first and second windings 51 and 52 may be magnetic wires, triple insulated wires, or the like; and both the first and second windings may have multiple turns.

The first winding 51 is arranged on the magnetic column at the lower left portion of the " ⊥ "-shaped intermediate magnetic core 4, and the second winding 52 is arranged on the magnetic column at the lower right portion of the " ⊥ "-shaped intermediate magnetic core 4. Further in detail, the first winding 51 is wound on the first magnetic column 41, so that a first inductor is formed collectively by the first winding 51, the first magnetic core 2, and the intermediate magnetic core 4, and a first magnetic path 401 is provided to the first inductor by the first magnetic core 2 and the intermediate magnetic core 4. The second winding 52 is wound on the second magnetic column 42, so that a second inductor is formed collectively by the second winding 52, the second magnetic core 3, and the intermediate magnetic core 4, and a second magnetic path 402 is provided to the second inductor by the second magnetic core 3 and the intermediate magnetic core 4.

A portion of the first magnetic path 401 between the first winding 51 and the second winding 52, that is, the portion thereof at the main magnetic column 40, does not pass any air gap. A portion of the second magnetic path 402 between the first winding 51 and the second winding 52, that is, the portion thereof at the main magnetic column 40, does not pass any air gap.

The inductor module is disposed on the main board 7, and the first winding 51 and the second winding 52 are electrically connected to the main board 7, respectively. There may be a mounting space between the inductor module and the main board 7 for accommodating at least one electronic component such as a capacitor 71, a semiconductor element 72, and the like.

In the power supply module having two output voltages according to the first embodiment of the disclosure, an induced voltage (i.e., leakage voltage) can be reduced or even avoided from being generated in the second inductor due to the first magnetic path, as well as in the first inductor due to the second magnetic path.

The Second Embodiment of the Power Supply Module

The power supply module according to the second embodiment of the present disclosure includes an inductor module and a main board (not shown). The main board and the related structure thereof may be the same as the main board 7 in the first embodiment, but the structure of the inductor module is different from that of the first embodiment.

Figure 5A:
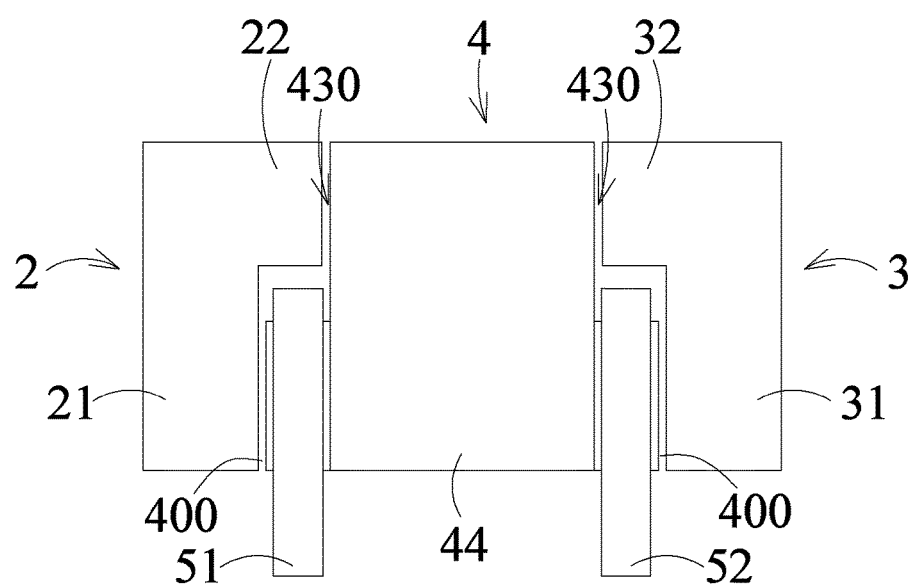
FIG. 5A is an assembly diagram illustrating an inductor module in the power supply module according to another embodiment of the present disclosure.
Figure 5B:
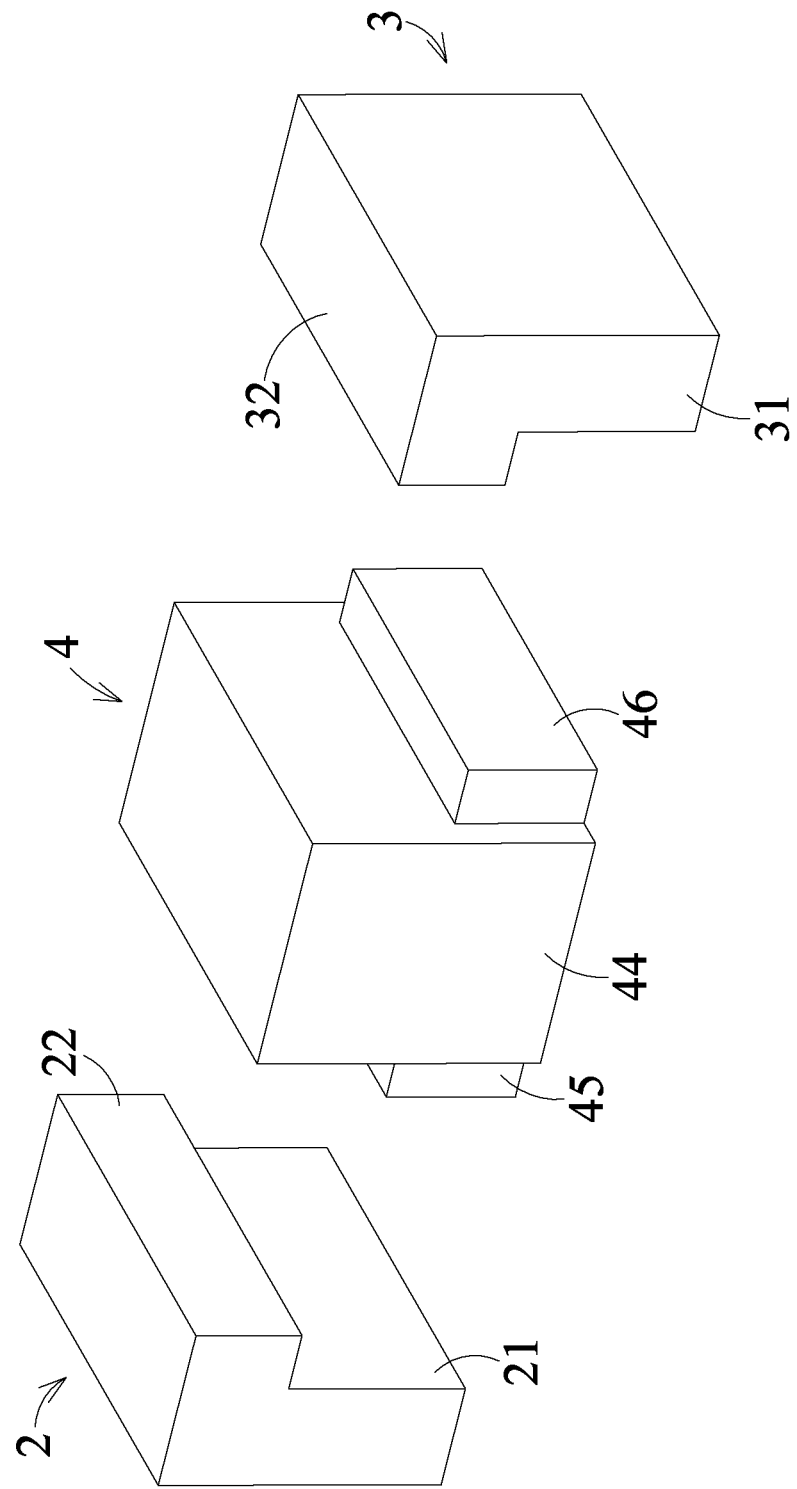
FIG. 5B illustrates an exploded view of the inductor module in the power supply module shown in FIG. 5A.

Referring to FIGS. 5A and 5B, FIG. 5A is an assembly diagram illustrating an inductor module in the power supply module according to the second embodiment of the present disclosure, FIG. 5B illustrates an exploded view of the inductor module in the power supply module shown in FIG. 5A. As shown in FIGS. 5A and 5B, the inductor module in the second embodiment includes a first magnetic core 2, a second magnetic core 3, an intermediate magnetic core 4, a first winding 51, and a second winding 52. The inductor module in the second embodiment is different from the inductor module of the first embodiment shown in FIGS. 4A, 4B, and 4C in following aspects.

The first magnetic core 2 is in a shape of " Γ " and includes a first magnetic column 21 and a second magnetic column 22 which are perpendicular to each other. The two magnetic columns may be integrally formed or may be formed in separate structures fixed to each other by means of bonding or the like.

The second magnetic core 3 is in a shape of " ⊓ " and includes a first magnetic column 31 and a second magnetic column 32 which are perpendicular to each other. The two magnetic columns may be integrally formed or may be formed in separate structures fixed to each other by means of bonding or the like.

The intermediate magnetic core 4 is in a shape of "⊥" and includes a main magnetic column 44, and a first magnetic column 45 and a second magnetic column 46 which are symmetrically disposed on both sides of the lower portion of the main magnetic column 44.

As shown in FIG. 5A, the first magnetic core 2 and the second magnetic core 3 are disposed symmetrically on both sides of the intermediate magnetic core 4. Air gaps 400 are formed, respectively, between the first magnetic column 21 of the first magnetic core 2 and the first magnetic column 45 of the intermediate magnetic core 4, and between the first magnetic column 31 of the second magnetic core 3 and the second magnetic column 46 of the intermediate magnetic core 4. Air gaps 430 are formed, respectively, between the second magnetic column 22 of the first magnetic core 2 and the main magnetic column 44 of the intermediate magnetic core 4, and between the second magnetic column 32 of the second magnetic core 3 and the main magnetic column 44 of the intermediate magnetic core 4.

The first winding 51 is arranged on the magnetic column at the lower left portion of the "⊥"-shaped intermediate core 4, and the second winding 52 is arranged on the magnetic column at the lower right portion of the "⊥"-shaped intermediate core 4. Further in detail, the first winding 51 is wound on the first magnetic column 45 of the intermediate magnetic core 4, and the second winding 52 is wound on the second magnetic column 46 of the intermediate magnetic core 4.

Other configuration of the power supply module according to the second embodiment of the present disclosure is basically the same as that of the first embodiment, and will not be elaborated here.

The Third Embodiment of the Power Supply Module

The power supply module according to the third embodiment of the present disclosure is different from the first embodiment shown in FIGS. 4A, 4B and 4C in the structure of the inductor module.

Figure 6A:
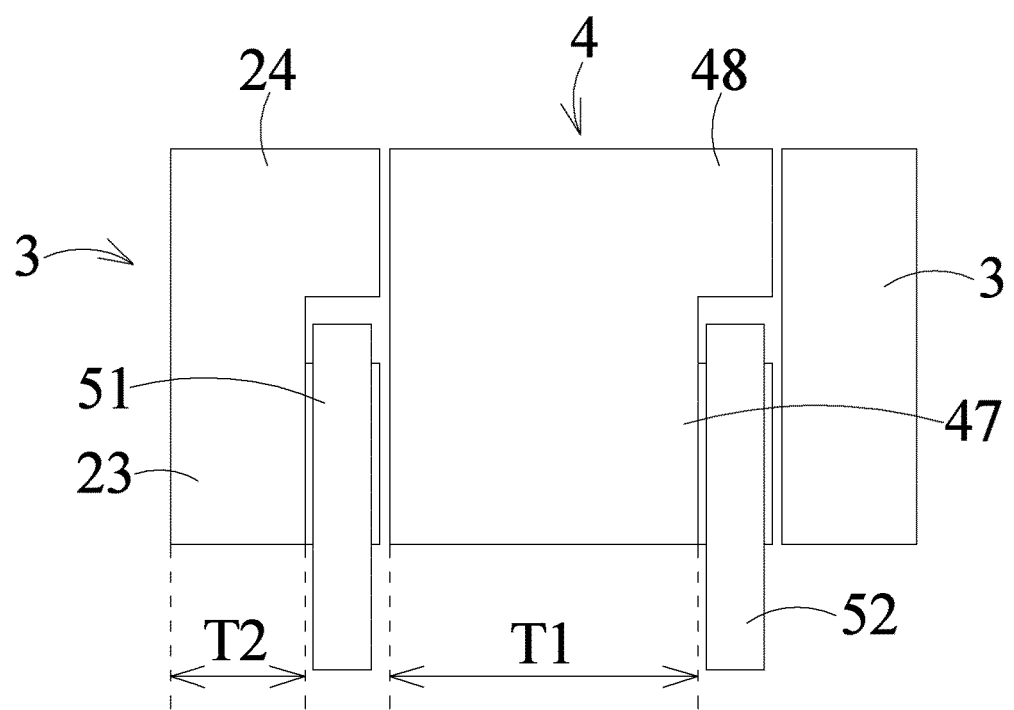
FIG. 6A is an assembly diagram illustrating an inductor module in the power supply module according to another embodiment of the present disclosure.
Figure 6B:
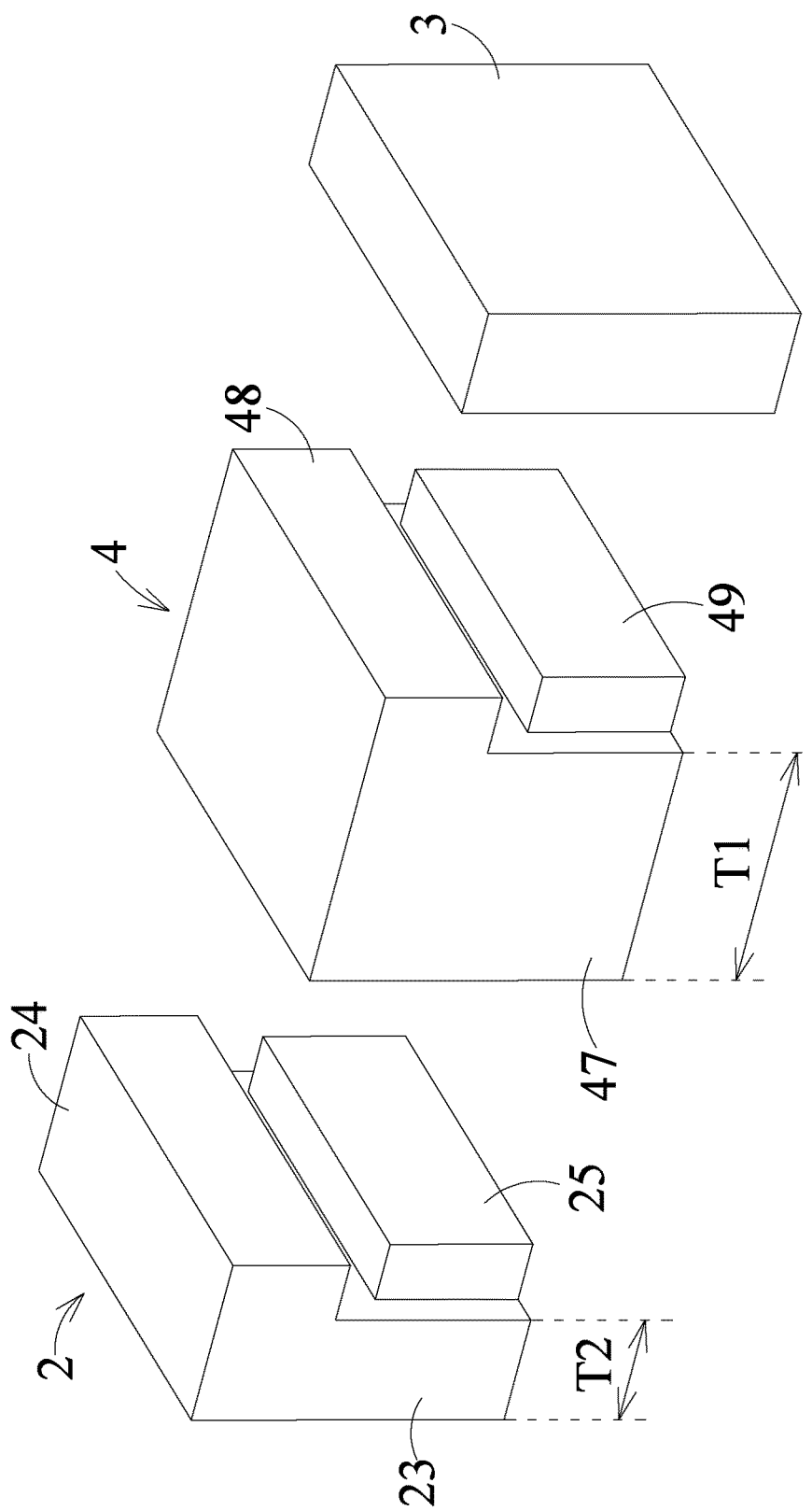
FIG. 6B illustrates an exploded view of the inductor module in the power supply module shown in FIG. 6A.

Referring to FIGS. 6A and 6B, FIG. 6A is an assembly diagram illustrating an inductor module in the power supply module according to the third embodiment of the present disclosure, FIG. 6B illustrates an exploded view of the inductor module in the power supply module shown in FIG. 6A. As shown in FIGS. 6A and 6B, the inductor module in the third embodiment includes a first magnetic core 2, a second magnetic core 3, an intermediate magnetic core 4, a first winding 51, and a second winding 52.

The first magnetic core 2 is in a shape of "L" and includes a first magnetic column 23, a second magnetic column 24 provided on the top side of the first magnetic column 23, and a third magnetic column 25 provided on the lower side of the first magnetic column 23. The second magnetic column 24 is disposed opposite to the third magnetic column 25.

The second magnetic core 3 is in a shape of "I", for example, in the shape of a flat plate.

The intermediate magnetic core 4 is in a shape of "Γ" and includes a first magnetic column 47, a second magnetic column 48 provided on the top side of the first magnetic column 47, and a third magnetic column 49 provided on the lower side of the first magnetic column 47. The second magnetic column 48 is disposed opposite to the third magnetic column 49. The first magnetic column 47 of the intermediate magnetic core 4 is parallel to the first magnetic column 23 of the first magnetic core 2, and a thickness T1 of the first magnetic column 47 is greater than a thickness T2 of the first magnetic column 23. In other embodiments, the thickness of the first magnetic column 47 may be the same as the thickness T2 of the first magnetic column 23 or may be smaller than the thickness T2 of the first magnetic column 23.

The first winding 51 is arranged on the magnetic column at the lower right of the "L"-shaped first magnetic core 2, and the second winding 52 is arranged on the magnetic column at the lower right of the "L"-shaped intermediate magnetic core 4. In detail, the first winding 51 is wound on the third magnetic column 25 of the first magnetic core 2, and the second winding 52 is wound on the third magnetic column 49 of the intermediate magnetic core 4.

Other configuration of the power supply module according to the third embodiment of the present disclosure is basically the same as that of the first embodiment, and will not be elaborated here.

The Fourth Embodiment of the Power Supply Module

The power supply module according to the fourth embodiment of the present disclosure is different from the first embodiment shown in FIGS. 4A, 4B and 4C in the structure of the inductor module.

Figure 7A:
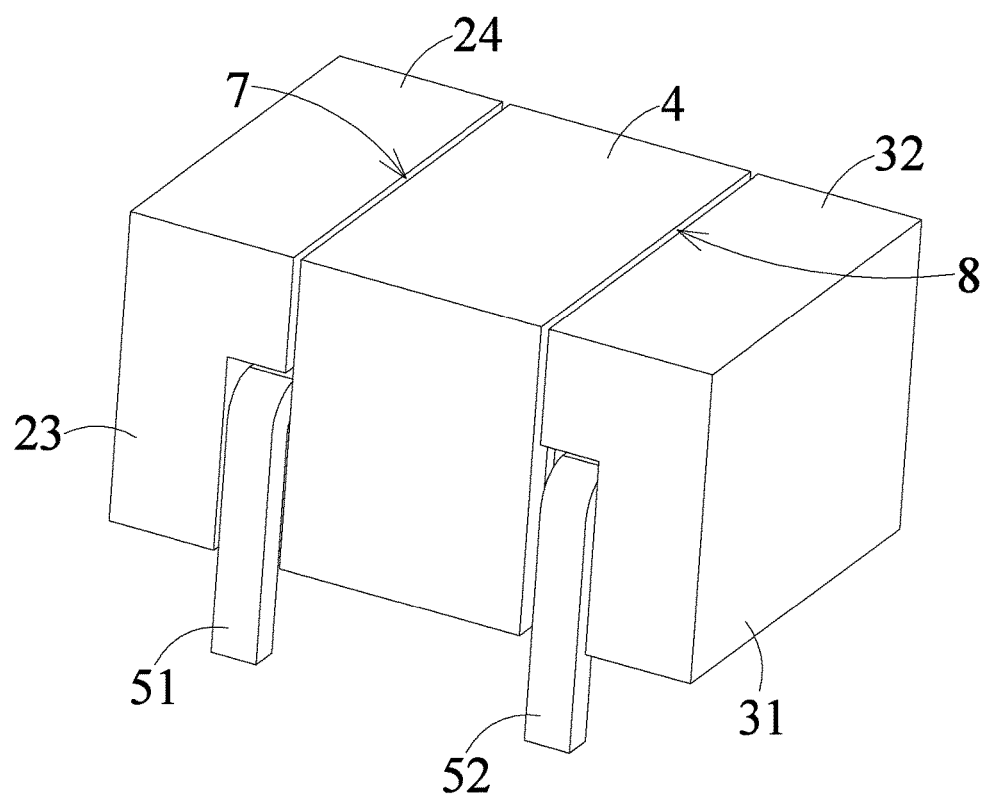
FIG. 7A is an assembly diagram illustrating an inductor module in the power supply module according to another embodiment of the present disclosure.
Figure 7B:
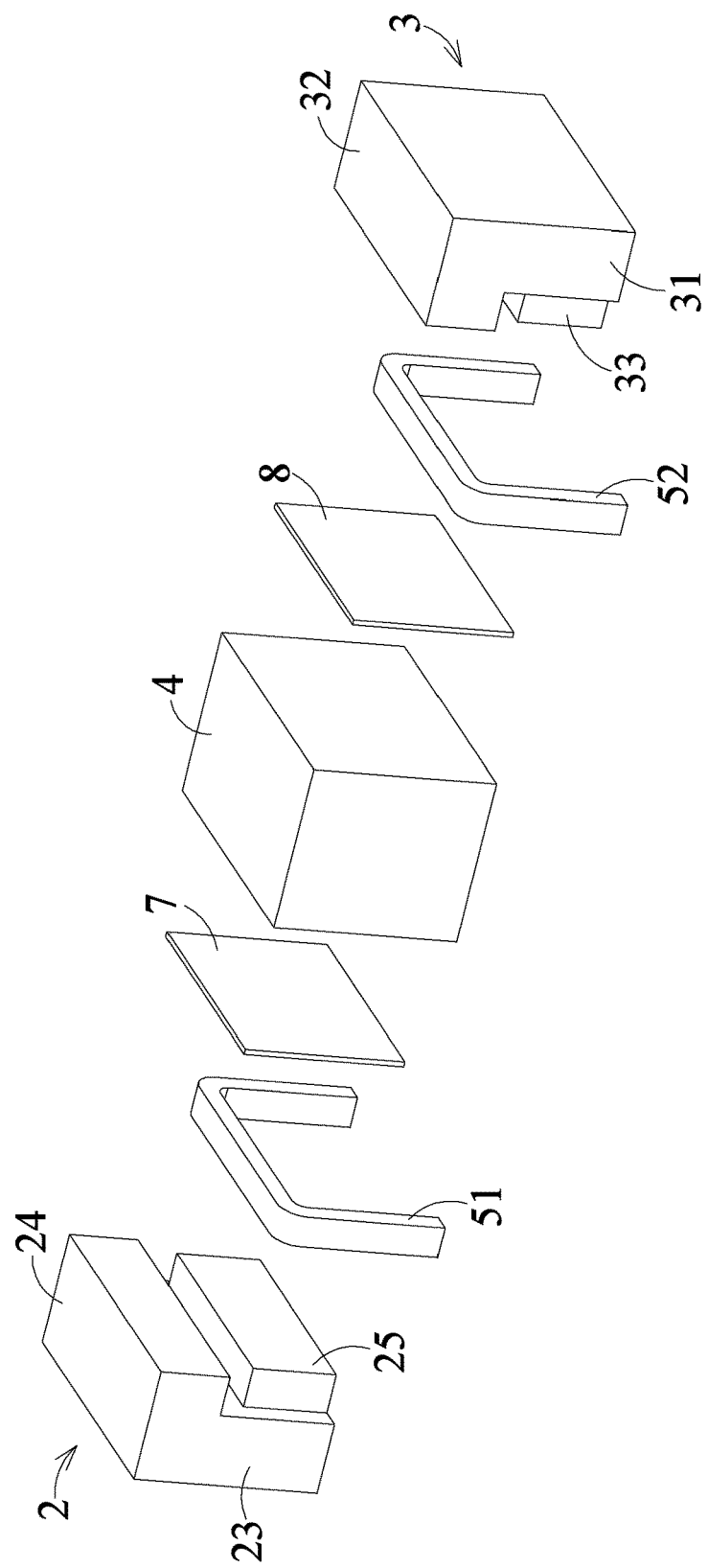
FIG. 7B illustrates an exploded view of the inductor module in the power supply module shown in FIG. 7A.

Referring to FIGS. 7A and 7B, FIG. 7A is an assembly diagram illustrating an inductor module in the power supply module according to the fourth embodiment of the present disclosure, FIG. 7B illustrates an exploded view of the inductor module in the power supply module shown in FIG. 7A. As shown in FIGS. 7A and 7B, the inductor module in the fourth embodiment includes a first magnetic core 2, a second magnetic core 3, an intermediate magnetic core 4, a first winding 51, and a second winding 52.

The first magnetic core 2 is in a shape of "⌐" and, like the first magnetic core 2 as shown in FIGS. 6A and 6B, includes a first magnetic column 23, a second magnetic column 24, and a third magnetic column 25. The second magnetic column 24 formed on the top side of the first magnetic column 23 is disposed opposite to the third magnetic column 25 formed on the lower side of the first magnetic column 23.

The intermediate magnetic core 4 is in a shape of "I", for example, in the shape of a cuboid.

The second magnetic core 3 is in a shape of "⌐", which may be a mirror structure of the first magnetic core 2. The second magnetic core 3 includes a first magnetic column 31, a second magnetic column 32 formed on the top side of the first magnetic column 31, and a third magnetic column 33 formed on the lower side of the first magnetic column 31. The second magnetic column 32 is disposed opposite to the third magnetic column 33.

The first winding 51 is arranged on the magnetic column at the lower right of the "⌐"-shaped first magnetic core 2, and the second winding 52 is arranged on the magnetic column at the lower left of the "⌐"-shaped second magnetic core 3. In other words, the first winding 51 is wound on the third magnetic column 25 of the first magnetic core 2, and the second winding 52 is wound on the third magnetic column 33 of the second magnetic core 3.

A first insulating sheet 7 is provided between the first magnetic core 2 and the intermediate magnetic core 4, and a second insulating sheet 8 is provided between the intermediate magnetic core 4 and the second magnetic core 3. The gap width between the first magnetic core 2 and the intermediate magnetic core 4 or the gap width between the intermediate magnetic core 4 and the second magnetic core 3 can be adjusted by changing the thicknesses of the first insulating sheet 7 and the second insulating sheet 8 accordingly. Moreover, the first insulating sheet 7 and the second insulating sheet 8 also support the first winding 51 and the second winding 52.

Alternatively, in other embodiments, the first insulating sheet 7 and the second insulating sheet 8 may not be provided.

Other configuration of the power supply module according to the fourth embodiment of the present disclosure is basically the same as that of the first embodiment, and will not be elaborated here.

The Fifth Embodiment of the Power Supply Module

The power supply module according to the fifth embodiment of the present disclosure includes an inductor module and a main board (not shown). The main board and the related structure thereof may be the same as the main board 7 in the first embodiment. The inductor module includes three inductors.

Figure 8A:
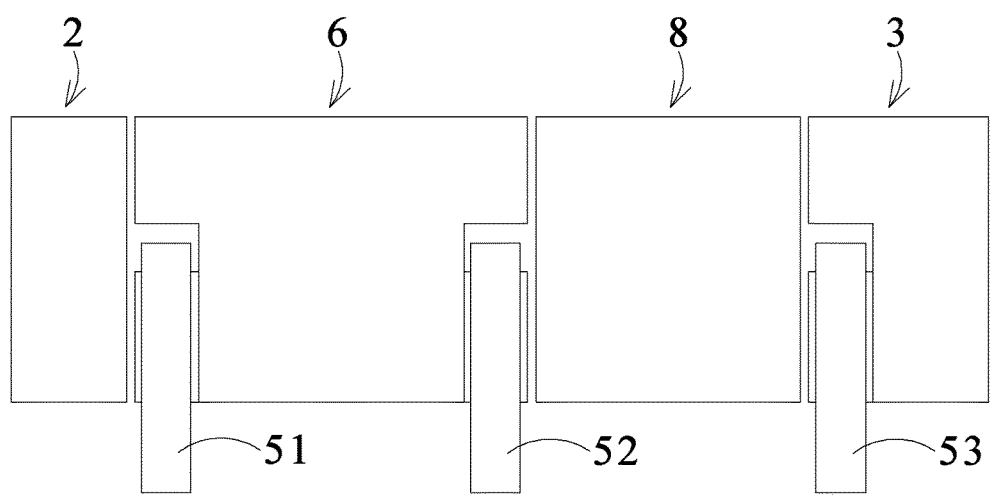
FIG. 8A is an assembly diagram illustrating an inductor module in the power supply module according to another embodiment of the present disclosure.
Figure 8B:
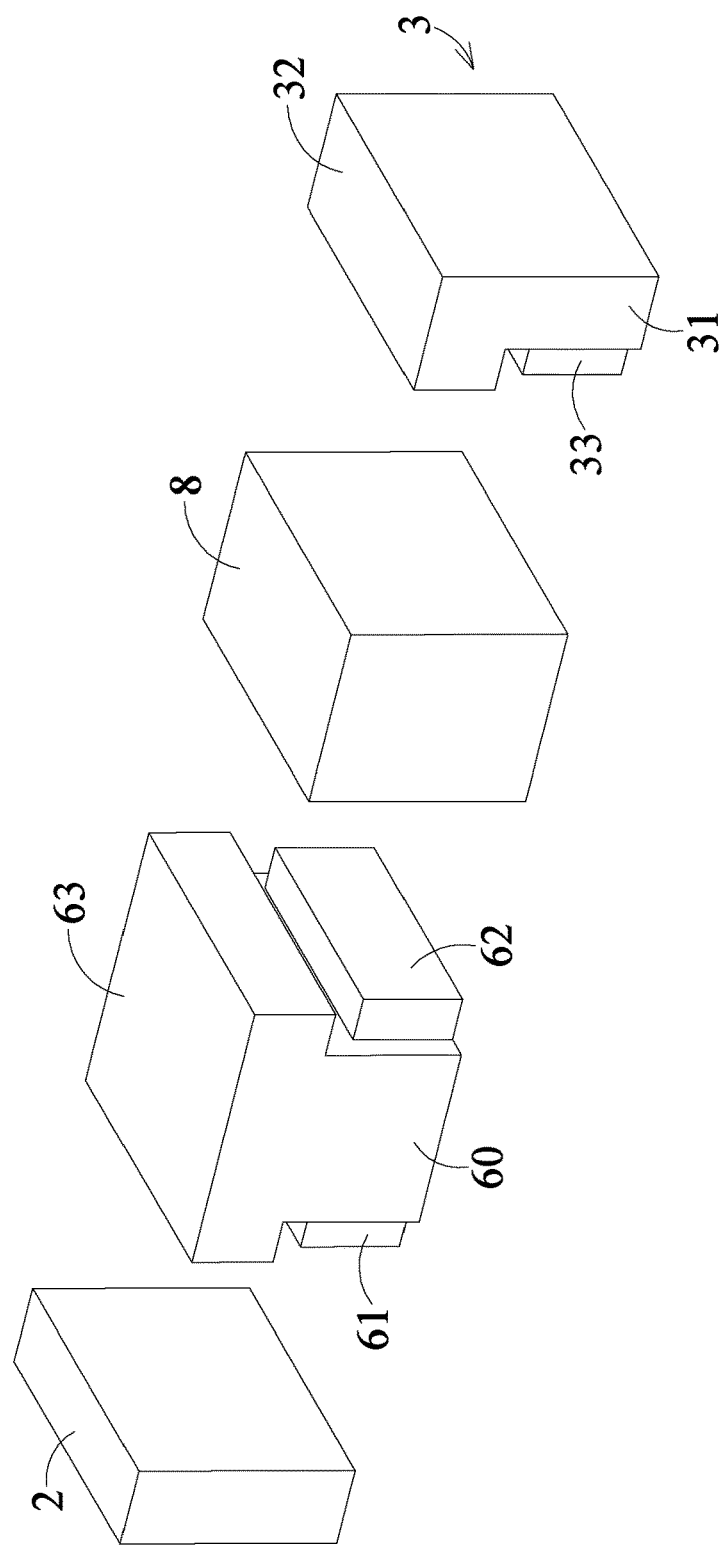
FIG. 8B illustrates an exploded view of the inductor module in the power supply module shown in FIG. 8A.

Referring to FIGS. 8A and 8B, FIG. 8A is an assembly diagram illustrating an inductor module in the power supply module according to the fifth embodiment of the present disclosure, FIG. 8B illustrates an exploded view of the inductor module in the power supply module shown in FIG. 8A. As shown in FIGS. 8A and 8B, the inductor module in the fifth embodiment includes a first magnetic core 2, a first intermediate magnetic core 6, a second intermediate magnetic core 8, and a second magnetic core 3, which are arranged in a row, and a first winding 51, a second winding 52, and a third winding 53.

The first magnetic core 2 may be in a shape of "I", for example, a flat magnetic core or a cuboid magnetic core or a cubic magnetic core.

The second magnetic core 3 may be, for example, implemented as the second magnetic core 3 shown in FIGS. 7A and 7B including a first magnetic column 31, a second magnetic column 32, and a third magnetic column 33.

The first intermediate magnetic core 6 may be, for example, implemented as the "⊥"-shaped intermediate magnetic core 6 shown in FIGS. 4B and 4C and includes a main magnetic column 60, a first magnetic column 61, a second magnetic column 62, and a third magnetic column 63.

The second intermediate magnetic core 8 may be an "I"-shaped magnetic core, for example, a cuboid magnetic core.

The first winding 51 is wound on the first magnetic column 61 of the first intermediate magnetic core 6, so that a first inductor is formed collectively by the first magnetic core 2, the first winding 51, and the first intermediate magnetic core 6, and a first magnetic path is provided to the first inductor by the first magnetic core 2 and the first intermediate magnetic core 6.

The second winding 52 is wound on the second magnetic column 62 of the first intermediate magnetic core 6, so that a second inductor is formed collectively by the second winding 52, the first intermediate magnetic core 6, and the second intermediate magnetic core 8, and a second magnetic path is provided to the second inductor by the first intermediate magnetic core 6 and the second intermediate magnetic core 8.

The third winding 53 is wound on the third magnetic column 33 of the second magnetic core 3, so that a third inductor is formed collectively by the third winding 53, the second intermediate magnetic core 8 and the second magnetic core 3, and a third magnetic path is provided to the third inductor by the second intermediate magnetic core 8 and the second magnetic core 3.

In the power supply module according to the fifth embodiment of the disclosure, there is no air gap at a portion of the first intermediate magnetic core 6 through which the first magnetic path and the second magnetic path pass together. In other words, the first magnetic path and the second magnetic path do not pass through any air gap at the portion of the first intermediate magnetic core 6. Moreover, there is no air gap at a portion of the second intermediate magnetic core 8 through which the second magnetic path and the third magnetic path pass together. In other words, the second magnetic path and the third magnetic path do not pass through any air gap at the portion of second first intermediate magnetic core 8.

In the power supply module according to the fifth embodiment of the present disclosure, an induced voltage can be reduced or even avoided from being generated in the second and third inductors due to the first magnetic path, as well as in the first and third inductors due to the second magnetic path, as well as in the first and second inductors due to the third magnetic path.

It is to be understood that the number of intermediate cores constituting the magnetic core structure in the inductor module of the present disclosure is not limited to one or two as described in the foregoing embodiments. There may be more intermediate magnetic cores included by the magnetic core structure in practice. For example, based on the fifth embodiment, a third intermediate magnetic core, a fourth intermediate magnetic core and the like may be further introduced. Accordingly, a fourth winding and a fifth winding may be further introduced. Each intermediate core may have at least a portion without any air gap, which provides a magnetic path for two adjacent inductors. In other words, the magnetic path of each inductor does not pass through any air gap in this portion of the intermediate core. To this end, the portions of each intermediate core through which the magnetic path of two adjacent inductors pass through are integrally formed without air gap, while the other portions may or may not have an air gap.

In summary, the inductor module having multiple intermediate magnetic cores can be applied to a power supply module having a plurality of output voltages. In an embodiment, the inductor module includes a first magnetic core, a plurality of intermediate magnetic cores, a second magnetic core and a plurality of windings which are arranged in a row. The plurality of windings are provided, respectively, on one of a magnetic column of the first magnetic core and a magnetic column of the intermediate magnetic core adjacent thereto, on one of magnetic columns corresponding to two adjacent intermediate magnetic cores, and on one of a magnetic column of the second magnetic core and a magnetic column of the intermediate magnetic core adjacent thereto, so as to form a plurality of inductors. Moreover, the plurality of inductors is provided with multiple magnetic paths, respectively, by the first magnetic core and the intermediate magnetic core adjacent thereto, by the two adjacent intermediate magnetic cores, and by the second magnetic core and the intermediate core adjacent thereto. Furthermore, there is no air gap at portions of the intermediate magnetic core through which any two adjacent magnetic paths pass together, so as to avoid or reduce an induced voltage, generated due to a magnetic path corresponding to one of the inductors, in the other inductors. The inductor module is disposed on the main board, and the pluralities of windings are electrically connected with the main board respectively.

Relative terms, such as "upper" and "lower", may be used in the above embodiments to describe the relative relationship between one depicted component and another. It will be understood that, when the depicted components is toggled upside down, the "upper" component as described may become "lower" components. Terms such as "a", "an", "the" and "at least one" are used to denote the presence of one or more elements/constituent parts and the like. Terms such as "comprise", "includes" and "has" are intended to indicate an open-ended inclusion relation, that is, there may be additional components other than listed components. Terms such as "first" and "second" are used only as a token rather than a numerical limitation on its object.

It is to be understood that this disclosure does not limit its application to the detailed construction and arrangement of the components set forth herein. The present disclosure can be implemented in other embodiments as well as practiced and carried out in various ways. The foregoing variations and modifications fall within the scope of the present disclosure. It is to be understood that the present disclosure disclosed and defined herein extends to all alternative combinations of two or more separate features mentioned or evident in the context and/or drawings. All of these different combinations constitute a number of alternative aspects of the present disclosure. The embodiments described herein illustrate the best mode known for implementing the present disclosure and will enable those skilled in the art to make use of the present disclosure.

What is claimed is:

1. A power supply module having two output voltages, comprising an inductor module and a main board, wherein the inductor module comprises:
    a first magnetic core;
    a second magnetic core;
    an intermediate magnetic core disposed between the first magnetic core and the second magnetic core;
    a first winding disposed on one of a magnetic column of the first magnetic core and a magnetic column of the intermediate magnetic core adjacent to the first magnetic core to form a first inductor, a first magnetic path of the first inductor being formed between the first magnetic core and the intermediate magnetic core;
    a second winding disposed on one of a magnetic column of the second magnetic core and a magnetic column of the intermediate magnetic core adjacent to the second magnetic core to form a second inductor, a second magnetic path of the second inductor being formed between the second magnetic core and the intermediate magnetic core;
    wherein there is no air gap at a portion of the intermediate magnetic core where the first magnetic path and the second magnetic path pass through together, so as to avoid or reduce an induced voltage generated in the second inductor due to the first magnetic path or another induced voltage generated in the first inductor due to the second magnetic path; and
    wherein the inductor module is disposed on the main board, and the first winding and the second winding are electrically connected with the main board respectively.

2. The power supply module according to claim 1, wherein the intermediate magnetic core is integrally formed without any air gap.

3. The power supply module according to claim 1, wherein both the first magnetic core and the second magnetic core are in shape of "I", and the intermediate magnetic core is in shape of "⊥".

4. The power supply module according to claim 3, wherein the first winding is arranged on a magnetic column at lower left of the intermediate magnetic core in the shape of "⊥", while the second winding is arranged on another magnetic column at lower right of the intermediate magnetic core in the shape of "⊥".

5. The power supply module according to claim 1, wherein both the first magnetic core and the intermediate magnetic core are in shape of "⊏", and the second magnetic core is in shape of "I".

6. The power supply module according to claim 5, wherein the first winding is arranged on a magnetic column at lower right of the first magnetic core in the shape of "⌐", while the second winding is arranged on a magnetic column at lower right of the intermediate magnetic core in the shape of "⊏".

7. The power supply module according to claim 1, wherein the first magnetic core is in shape of "⊏", the intermediate magnetic core is in shape of "I", and the second magnetic core is in shape of "⊐".

8. The power supply module according to claim 7, wherein the first winding is arranged on a magnetic column at lower right of the first magnetic core in the shape of "⌐", while the second winding is arranged on a magnetic column at lower left of the second magnetic core in the shape of "⊐".

9. The power supply module according to claim 1, wherein the first magnetic core is in shape of "⌈", the intermediate magnetic core is in shape of "⊥", and the second magnetic core is in shape of "⌉".

10. The power supply module according to claim 9, wherein the first winding is arranged on a magnetic column at lower left of the intermediate magnetic core in the shape of "⊥", while the second winding is arranged on another magnetic column at lower right of the intermediate magnetic core in the shape of "⊥".

11. The power supply module according to claim 1, wherein an air gap is provided between the first magnetic core and the intermediate magnetic core, and another air gap is provided between the second magnetic core and the intermediate magnetic core.

12. The power supply module according to claim 1, wherein both the first winding and the second winding are preformed metallic conductors.

13. The power supply module according to claim 1, wherein the first winding comprises one turn and the second winding comprises one turn.

14. The power supply module according to claim 1, wherein a mounting space, configured to accommodate at least one electronic component therein, is provided between the inductor module and the main board.

15. The power supply module according to claim 1, wherein the intermediate magnetic core is made of ferrite.

16. A power supply module having multiple output voltages, comprising an inductor module and a main board, wherein the inductor module comprises a first magnetic core, multiple intermediate magnetic cores, a second magnetic core and multiple windings, which are arranged in a row,
    the multiple windings are disposed, respectively, on one of a magnetic column of the first magnetic core and a magnetic column of the intermediate magnetic core which is one of the multiple intermediate magnetic cores adjacent to the first magnetic core, on one of two magnetic column of two adjacent ones of the multiple intermediate magnetic cores, and on one of a magnetic column of the second magnetic core and a magnetic column of the intermediate magnetic core which is one of the multiple intermediate magnetic cores adjacent to the second magnetic core, to form multiple inductors, the multiple inductors being provided, respectively, with multiple magnetic paths by the first magnetic core and the intermediate magnetic core adjacent to the first magnetic core, by the two adjacent ones of the multiple intermediate magnetic cores, and by the second magnetic core and the intermediate magnetic core adjacent to the second magnetic core;
    wherein there is no air gap at a portion of the intermediate magnetic core where any two adjacent ones of the multiple magnetic paths pass through together, so as to avoid or reduce an induced voltages generated in other ones of the multiple inductors, due to one of the multiple magnetic paths corresponding to one of the multiple inductors, in; and wherein the inductor module is disposed on the main board, and the multiple windings are electrically connected with the main board respectively.

17. The power supply module according to claim 16, wherein the multiple intermediate magnetic cores are integrally formed without any air gap.

18. The power supply module according to claim 16, wherein the multiple intermediate magnetic cores comprise a first intermediate magnetic core and a second intermediate magnetic core.

19. The power supply module according to claim 18, wherein both the first magnetic core and the second intermediate magnetic core are in shape of "I", the first intermediate magnetic core is in shape of " T ", and the second magnetic core is in shape of "⊐".

20. The power supply module according to claim 19, wherein the multiple windings comprises: a first winding arranged on a magnetic column at lower left of the first intermediate magnetic core in the shape of " I ", a second winding arranged on a magnetic column at lower right of the first intermediate magnetic core in the shape of " I ", and a third winding arranged on a magnetic column at lower left of the second magnetic core in the shape of "⊐".

* * * * *